United States Patent [19]
Kudoh

[11] Patent Number: 5,307,064
[45] Date of Patent: Apr. 26, 1994

[54] DIGITAL-TO-ANALOG CONVERTER CAPABLE OF REDUCING LOAD OF LOW-PASS FILTER

[75] Inventor: Youichi Kudoh, Ichinomiya, Japan

[73] Assignee: Tekuno Esu Kabushiki Kaisha, Nagoya, Japan

[21] Appl. No.: 942,236

[22] Filed: Sep. 9, 1992

[30] Foreign Application Priority Data

Sep. 9, 1991 [JP] Japan .................. 3-258434

[51] Int. Cl.$^5$ ............................................. H03M 1/66
[52] U.S. Cl. ..................................... 341/144; 341/146
[58] Field of Search ............... 341/144, 146, 126, 150, 341/153, 154

[56] References Cited
U.S. PATENT DOCUMENTS 5,008,674 4/1991 Da Franca et al. ............. 341/144 X Primary Examiner—Sharon D. Logan
Attorney, Agent, or Firm—Nikaido, Marmelstein, Murray & Oram

[57] ABSTRACT

A digital-to-analog (D/A) converter used for a digital audio equipment, comprises a binary D/A converting circuit and a calculation processing circuit for receiving an analog signal derived from the binary D/A converting circuit. This D/A converter is capable of considerably reducing a load given to an LPF (low-pass filter) or, of omitting such an LPF. The binary D/A converting circuit outputs an analog signal value corresponding to each sampling point of a digital signal as a first analog output value, and also outputs an analog output signal value delayed by only 1 sampling period as a second analog output value. A difference calculating unit of the calculation processing circuit calculates a difference value between the first analog output value as a first analog input value, and the second analog output value as a second analog input value. The resultant difference value is integrated by an integrating unit and the integrated difference value is outputted as an analog output value from the calculation processing circuit. A portion of the output value of the integrating unit is returned to the input side of the difference calculating unit to be added to the second analog input signal value.

6 Claims, 5 Drawing Sheets

DIGITAL-TO-ANALOG CONVERTER CAPABLE OF REDUCING LOAD OF LOW-PASS FILTER

BACKGROUND OF THE INVENTION

(1) Field of the Invention

The present invention relates to a digital-to-analog (D/A) converter connected at a poststage of a digital signal processing circuit in a digital audio appliance.

(2) Description of the Prior Art

Generally speaking, in such a sort of digital-to-analog converter (will be referred to a "D/A converter"), it is so arranged that a digital signal value outputted at each sampling point of a digital signal processing circuit is converted into an analog signal value (analog stepped wave) by way of a ladder type D/A convertering circuit, and then the resultant analog signal value is filtered by an LPF (low-pass filter to remove a high frequency signal component therefrom.

Then, the load given to the LPF is reduced by employing such a technique as over sampling operation, so that deterioration of audient sound (tone) quality caused by the LPF may be mitigated.

However, since the output signal wave of the above-described conventional D/A converter has a shape of a stepped waveform, the low-pass filter (LPF) is necessarily required. Accordingly, the phase characteristic is deteriorated and the lengthy delay time occurs due to an employment of such an LPF. It is therefore difficult to improve the audient sound quality at a satisfactory level.

SUMMARY OF THE INVENTION

A digital-to-analog converter, according to one aspect of the present invention, is constructed of:

a binary digital-to-analog (D/A) converting circuit for outputting a digital output signal value, as a first analog output signal value, corresponding to each sampling point of a digital signal, and for outputting a digital output signal value, as a second analog output signal value, produced by delaying the first analog output signal value by only a 1 sampling period; and a calculation processing circuit for inputting therein the analog signal values derived from the binary D/A converting circuit, said calculation processing circuit being arranged by a difference calculating unit for calculating a difference value between a first analog input signal value corresponding to said first analog output signal value and a second analog input signal value corresponding to said second analog output signal value, an integrating unit for integrating a difference value obtained from the difference calculating unit, and also an adding unit for adding an output value of the integrating unit with said second analog input signal value, whereby the output value of said integrating unit is outputted as an analog output value.

The binary DIA converting circuit is arranged by:

a first D/A converting circuit for converting the digital output signal value corresponding to each sampling point of the digital signal into an analog signal value;

a delay circuit for delaying said digital output value by only the 1 sampling period; and, a second D/A converting circuit for converting a digital signal value of said delay circuit into an analog signal value.

Also, the binary D/A converting circuit may be constructed of:

a digital-to-analog converting circuit for converting the digital output signal value corresponding to the respective sampling points of the digital signal into an analog signal value; and a delay circuit for delaying said analog signal value by only a 1 sampling period.

The calculation processing circuit is arranged in such a manner that:

a first analog input corresponding to a digital signal is connected via a first resistor to one input side of an operational amplifying circuit;

a second analog input corresponding to said digital signal and also delayed by only a 1 sampling period, is connected via a second resistor to the other input side of said operational amplifying circuit;

said one input side of the operational amplifying circuit is connected to an output side of the operational amplifying circuit by a third resistor;

a first series circuit constructed of a fourth resistor and a first capacitor is connected between the output side of said operational amplifying circuit and a ground;

a fifth resistor is connected between said the other input side of the operational amplifying circuit and the ground; and a series circuit constructed of a sixth resistor and a buffer circuit is connected between a junction point between the fourth resistor of the series circuit and the first capacitor, and also said the other input side of the operational amplifying circuit.

Further, the calculation processing circuit may be arranged in such a manner that:

a first analog input corresponding to a digital signal is connected via a first resistor to one input side of an operational amplifying circuit;

a second analog input corresponding to said digital signal and also delayed by only a 1 sampling period, is connected via a second resistor and a second capacitor to the other input side of said operational amplifying circuit;

said one input side of the operational amplifying circuit is connected to an output side of the operational amplifying circuit by a third resistor;

a first series circuit constructed of a fourth resistor and a first capacitor is connected between the output side of said operational amplifying circuit and a ground;

a fifth resistor is connected between said the other input side of the operational amplifying circuit and the ground; and a series circuit constructed of a sixth resistor and a buffer circuit is connected between a junction point between the fourth resistor of the series circuit and the first capacitor, and also a junction point between said second resistor and said second capacitor.

Then, the calculation processing circuit may be arranged by first, second, third, - - -, N-th calculation processing circuits, and is constructed in such a manner that:

both of an analog signal value corresponding to a digital signal and of an analog signal value corresponding to said digital signal and delayed by only a 1 sampling period are inputted to a first calculation processing circuit;

both of analog signal values corresponding to said digital signal and delayed by only $1/N, 2/N, - - -, (N-1/N)$ sampling periods, and of analog signal values corresponding said digital signal and delayed by only 1/N+1, 2/N+1, - - -, (N−1)/N+1 sampling periods are inputted to the second, third, - - -, N-th calculation processing circuits; and an adding/averaging circuit for adding or averaging the output signal values of all calculation processing circuits is connected to the output sides of said first, second, third, - - -, N-th calculation processing circuits.

In accordance with the D/A converter of the present invention, the output waveform of this D/A converter corresponds to such a waveform produced by continuously connecting the sampling values of the adjacent sampling points by the straight line. In other words, since the output waveform becomes the smoothed analog waveform, the analog output signal waveform on which the high frequency components are not superimposed can be obtained. As a consequence, the load of the LPF connected at the poststage of this D/A converter can be reduced, and therefore the audient sound quality can be improved. The LPF may be omitted, if required.

Furthermore, according to another D/A converter of the present invention, since the output waveform of the adding/averaging circuit corresponds to such a waveform generated by furthermore subdividing the sampling values of the adjoining sampling pulses and by continuously connecting the subdivided sampling values, the analog output waveform smoother than the first-mentioned analog output waveform obtained by the above-described D/A converter. As a consequence, the load reduction effect of the LPF may be furthermore achieved, and then the audient sound quality may be furthermore improved. Thus, the LPF may be omitted, if required.

As previously described, an object of the present invention is to provide a digital-to-analog converter capable of considerably reducing the load given to the LPF, otherwise capable of omitting this LPF, and also capable of improving the audient sound quality.

DESCRIPTION OF THE PREFERRED EMBODIMENTS

Referring now to drawings, D/A converters according to preferred embodiments of the present invention will be described.

Figure 1:
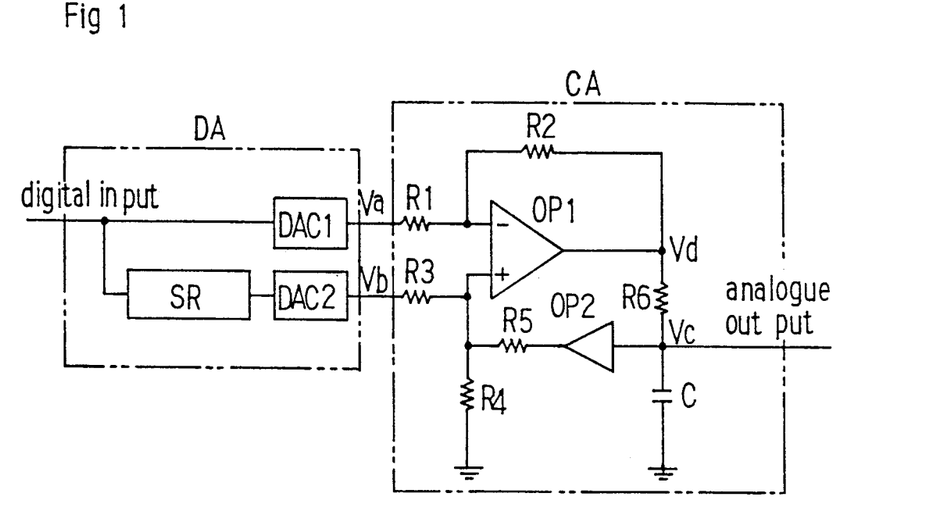
FIG. 1 is a schematic block diagram for showing an arrangement of a D/A converter according to a first preferred embodiment of the present invention.
Figure 3A:
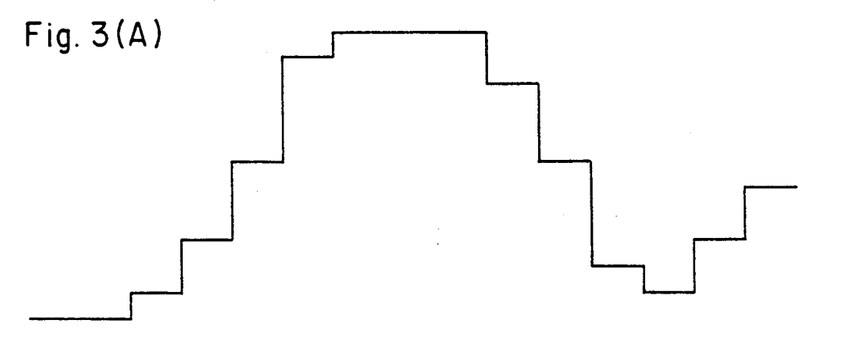
FIG. 3(A) and 3(B) represent waveform charts for explaining operations of the D/A converters according to the first and second preferred embodiment.
Figure 3B:
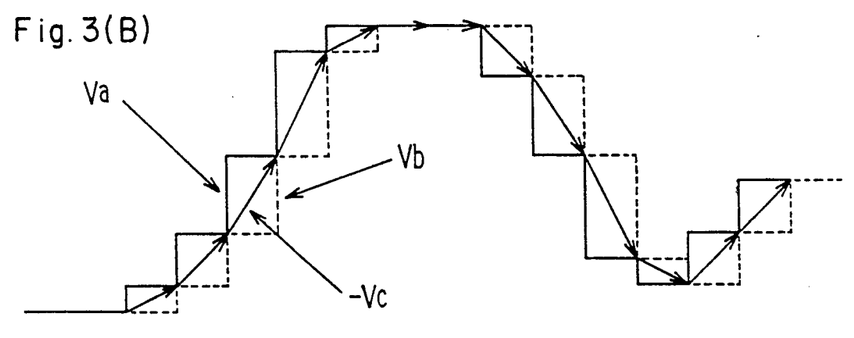

1 First Preferred Embodiment (FIGS. 1 and 3)

A digital-to-analog converter (D/A converter) according to a first preferred embodiment is constructed of a binary D/A converting circuit DA and a calculation processing circuit CA.

Then, the binary D/A converting circuit DA is arranged as follows. A first digital-to-analog converting circuit DAC1 corresponds to a ladder resistor type digital-to-analog converting circuit for converting a digital output signal value corresponding to the respective sampling points of a digital signal processing circuit (not shown), into an analog signal value.

A delay circuit SR corresponds to a digital delay circuit constructed of a shift register and the like, and for delaying the digital signal value outputted from the digital signal processing circuit by 1 (one) sampling period.

A second digital-to-analog converting circuit DAC2 corresponding to a ladder resistor type D/A converting circuit for converting the digital signal value outputted from the delay circuit SR into an analog signal value. Then, the binary D/A converting circuit DA is arranged by the above-described arrangements.

Subsequently, the calculation processing circuit CA is constructed as follows:

An output side of the first D/A converting circuit DAC 1 is connected via a resistor (first resistor) R1 to a negative polarity input side of an operational amplifying circuit OP1.

An output side of the second D/A converting circuit DAC 2 is connected via a resistor (second resistor) R3 to a positive-polarity input side of the operational amplifying circuit OP1. The negative-polarity input side of the operational amplifying circuit OP1 is connected via a resistor (third resistor) R2 to an output side of the operational amplifying circuit OP1. The output side of the operational amplifying circuit OP1 is connected via a resistor (fourth resistor) R6 to one end of a capacitor C, the other end of which is grounded. Both of these resistor R6 and capacitor C constitute an integration circuit. A junction point between the resistor R6 and the capacitor C, namely an output point of the D/A converter is connected in such a manner that an output signal from this junction point is fed back via a buffer circuit OP2 (amplification=1) and a resistor R5 (fifth resistor) to the positive-polarity input side of the operational amplifying circuit OP1. The positive input side of the operational amplifying circuit OP1 is grounded via the resistor R4. With the above-described arrangements, the operational processing circuit CA is constructed.

A digital signal derived from the digital signal processing circuit is inputted into the digital-to-analog converting circuit DAC1 to produce an analog voltage "Va". Furthermore, the digital signal is delayed by only 1 sampling period in the delay circuit SR, and then the delayed digital signal is also inputted to the second digital-to-analog converting circuit DAC2 to generate an analog voltage "Vb". The analog voltage Va is inputted via the resistor R1 to the negative-polarity input side of the operational amplifying circuit OP1. On the other hand, the analog voltage "Vb" is inputted via the resistor R3 to the positive-polarity input side of the operational amplifying circuit OP1, so that an output voltage Vd is produced at the output side of the operational amplifying circuit OP1, and also an output voltage Vc is generated at the junction point between the resistor R6 and the capacitor C, namely at the output side of the D/A converter.

The output voltage Vc produced at the output terminal by the above-described circuit arrangement, becomes a linear integral vector as indicated by an arrow of FIG. 3B. It should be noted in FIG. 3B that the stepped waveforms "Va" (waveform denoted by a solid line) and "Vb" (waveform shown by a dot line) correspond to the analog voltages "Va" and "Vb" indicated in FIG. 1, respectively.

Based on the circuit arrangement of FIG. 1, an operation thereof will now be described.

For the sake of simplicity, assuming now that the resistor R1=resistor R2=resistor R3=resistor R4=resistor R5=R, voltage changes appearing at the respective nodes are defined as follows: Assuming that a voltage at the positive-polarity input side of the operational amplifying circuit OP1 is "Vi", this voltage "Vi" is given by the following equation (1):

$$Vi=(Vb+Vc)/K1 \qquad (1)$$

Also, a voltage "Vd" outputted from the operational amplifying circuit OP1 is given by the below-mentioned equation (2):

$$Vd=K2\times(Vb+Vc)-Va \qquad (2)$$

where,
$K1=3$ and $K3=\frac{2}{3}$.

It should be noted that the values of K1 and K2 may be changed by varying the resistance values of the resistors R1 to R5.

Then, an output voltage "Vc" is given by the following equation (3), since this voltage is produced by integrating a difference between the output voltage "Vd" and the voltage Vc obtained before 1 sampling operation (=Vc0) by the resistor R6 and the capacitor C with respect to this voltage "Vc0":

$$Vc=(Vd-Vc0)\times(1-EXP(-t/\tau))+Vc0 \qquad (3)$$

where, $\tau=C\times R6$

Assuming now that initial values of the voltages "Vb" and "Vc" are zero (0) at time "t"=0, the voltage "Vd"=−Va based upon the equation (2), and a voltage obtained by reversing the voltage "Va" is produced as the voltage "Vd". Then, during a time period of 0<t<ts ("ts" being a sampling time interval), the voltage "Vc" is integrated in accordance with the equation (3). However, an attention should be paid to such a fact that the voltage "Vd" used to determining the voltage "Vc" is a function of the voltage "Vc", as apparent from the equation (2), the voltage "Vd" is also varied in the same direction to the variation of the voltage Vc, and therefore the current flowing through the resistor R6 is controlled and the integrated voltage is shifted in a linear form. Then, if the time constant "τ" is so set that the voltage Vc=−Vb at time "t"=ts, the integral vector of the voltage "Vc" is varied in response to the voltage "Va". With respect to the DC values of the voltage "Va"=the voltage Vb, since Vc=−Vb as apparent from the equation (2), the voltage "Vd"=−Va, becomes constant. As a result, the voltage Vc=−Va is maintained, and the DC components may be reproduced without any problem. It should be noted that since the voltage "Vc" correspond to an inverted voltage with regard to the voltages "Va" and "Vb", this voltage is not shown in the drawing, and the inverting function is required in either the digital signal part of the D/A converting circuit, or the analog signal part thereof positioned at the poststage.

In accordance with the first D/A converter of the present invention, since the signal integration can be effectively performed due to the small CR time constant and the digital noise can be hardly produced at the integrating part of the first D/A converter, a very smooth analog signal wave can be reproduced. A low-pass filter (not shown in detail) positioned at the poststage of the first D/A converter may be completely omitted. Moreover, in principle, no phase variation caused by the changes in the signal frequency is produced, and also the digital-to-analog converting time defined from the digital signal input to the analog signal output can be minimized. As a consequence, the audient sound (tone) quality may be improved up to the optimal quality.

Figure 2:
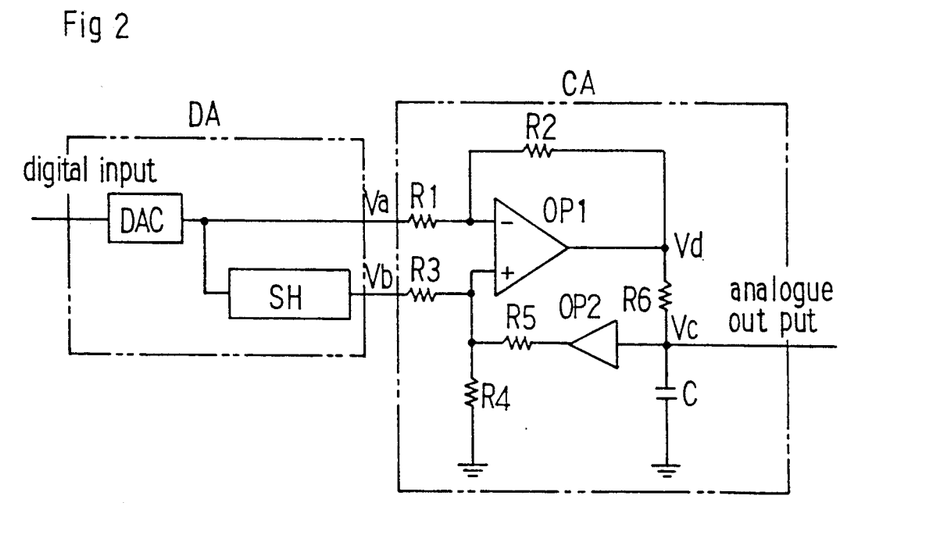
FIG. 2 is a schematic block diagram for representing an arrangement of a D/A converter according to a second preferred embodiment of the present invention.

2 Second Preferred Embodiment (FIG. 2)

This second preferred embodiment relates to another digital-to-analog converter of the present invention.

This D/A converter is such a type of binary digital-to-analog converter DA that the analog voltages "Va" and "Vb" as explained in FIG. 1 are produced by way of a single D/A converting circuit DAC.

A D/A converting circuit DAC corresponds to a ladder type D/A converting circuit for converting a digital output signal value related to each sampling point of a digital signal processing circuit (not shown) into an analog signal value, which is similar to that of FIG. 1. A sample and hold circuit SH is such an analog delay circuit for delaying an analog signal output value of the D/A converting circuit DAC by only 1 sampling period, which is different from the digital delay circuit shown in FIG. 1. A digital signal from the digital signal processing circuit is inputted into the digital-to-analog converting circuit to generate an analog signal "Va". The analog voltage signal Va is delayed by the sample and hold circuit SH, so that another analog voltage "Vb" is produced.

Since an operation that an integral vector Vc is produced from the analog voltages Va and Vb at an output side of this D/A converter is the same as that of the D/A converter shown in FIG. 1, an explanation thereof will be omitted. It should be noted that the same reference numerals shown in FIG. 2 represent the same, or similar circuit elements of FIG. 1.

Figure 4:
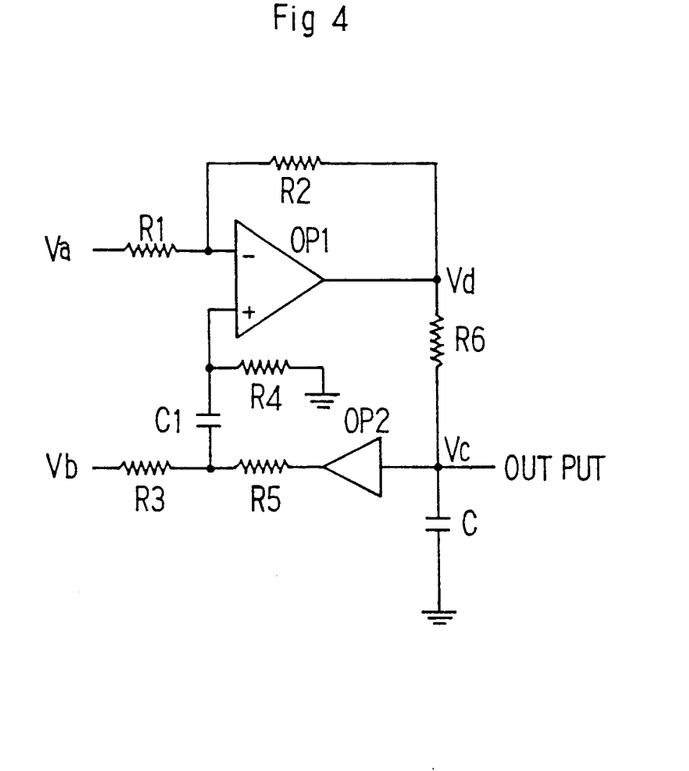
FIG. 4 is a schematic diagram for indicating a calculation processing circuit according to a third preferred embodiment of the present invention.

3 Third Preferred Embodiment (FIG. 4)

This preferred embodiment relates to a further digital-to-analog converter according to the present invention.

A basic idea of the D/A converter according to the present invention is such that a difference between binary analog data is integrated and the integrated values are successively accumulated. As a result, there is such an initial condition that the difference between the binary analog data becomes zero under the normal condition, and no integration is carried out with maintaining the normal value. If the difference between the analog output "Va" and the analog output "Vb" under the normal condition is a sufficiently small, there is no problem. However, in case that the difference between the analog output Va and the analog output Vb under the normal condition is not negligible, this difference would be integrated, resulting in an occurrence of noise.

To improve this difficulty, the D/A converter according to this third preferred embodiment is employed.

As represented in FIG. 4, in this calculation processing circuit CA, the analog output "Va" which has been obtained by converting the digital signal value into the analog signal value in a D/A converting circuit (not shown), is inputted via a resistor R1 to a negative-polarity input side of an operational amplifying circuit OP1. The analog output Vb which has been delayed by only 1 sampling period, as compared with the analog output Va, in a delay circuit (not shown), is inputted via the resistor R3 and the capacitor C1 to the positive-terminal input side of the operational amplifying circuit OP1. This positive-polarity input side of the operational amplifying circuit OP1 is grounded through the resistor R4.

An output side of the operational amplifying circuit OP1 is grounded via a series circuit arranged by the resistor R6 and the capacitor C. A junction point between the resistor R6 and the capacitor C, namely an output side of the D/A converter is connected via the buffer circuit OP2 and the resistor R5 to a junction point between the resistor R3 and a capacitor (second capacitor) C1 in such a manner that a signal appearing at this junction between the resistor R6 and the capacitor C is fed back to the positive-polarity input side of the operational amplifying circuit OP1. With such an arrangement, the calculation processing circuit CA is constructed.

In particular, it should be noted that the capacitor C1 is added to the D/A converter of the third preferred embodiment so as to cut the influences caused by the voltages "Vb" and "Vc" under the normal condition. As a consequence, the generation of the vector of the voltage Va=Vb is carried out in a similar manner to that of FIGS. 1 and 2, and the operational amplifying circuit OP1 merely functions as an inverting amplifier for the analog signal output Va, so that the production of noise can be suppressed.

Figure 5:
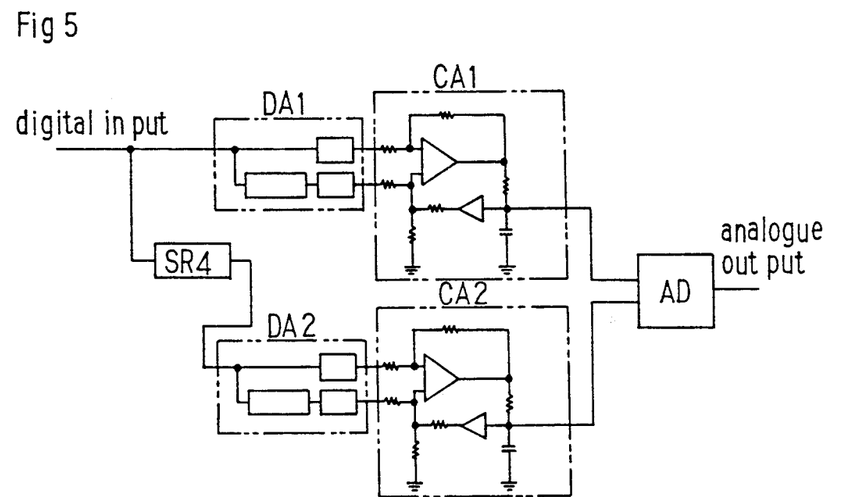
FIG. 5 is a schematic diagram for showing an arrangement of a D/A converter according to a fourth preferred embodiment of the present invention.
Figure 6:
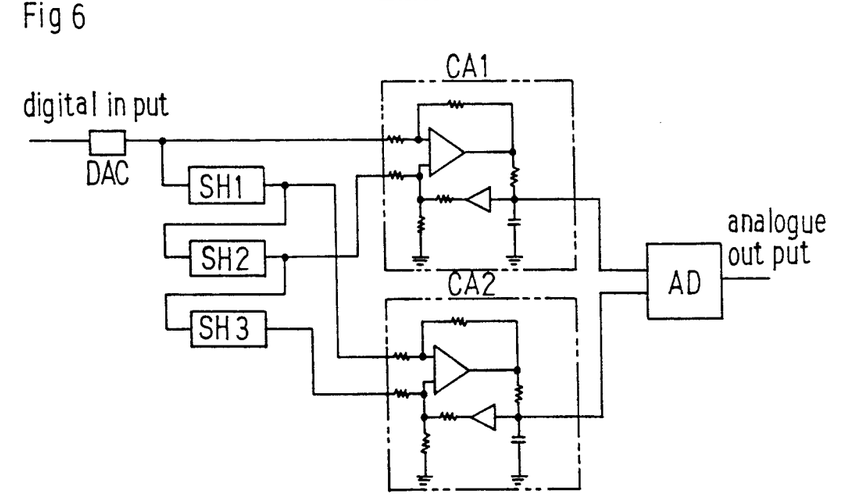
FIG. 6 is a schematic diagram for indicating an arrangement of a D/A converter according to a fifth preferred embodiment.
Figure 7A:
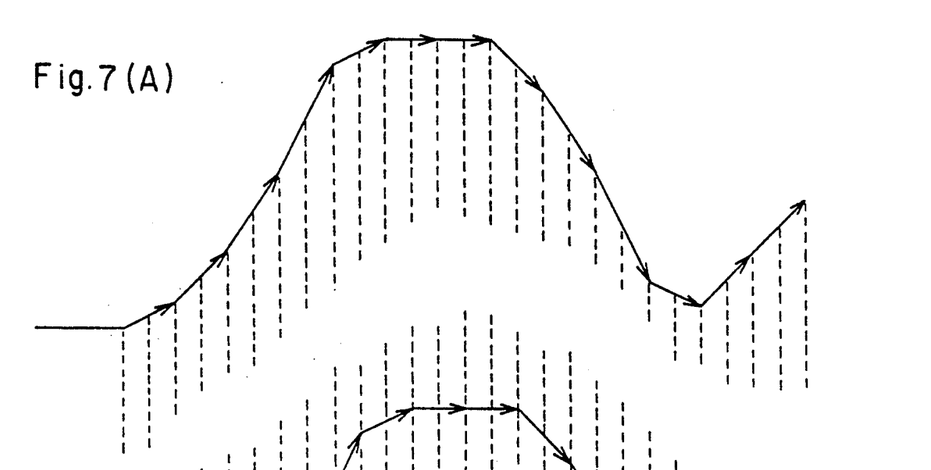
FIG. 7(A)-7(C) show waveform charts for describing operations of the D/A converters according to the fourth and fifth preferred embodiments.
Figures 7B, 7C:
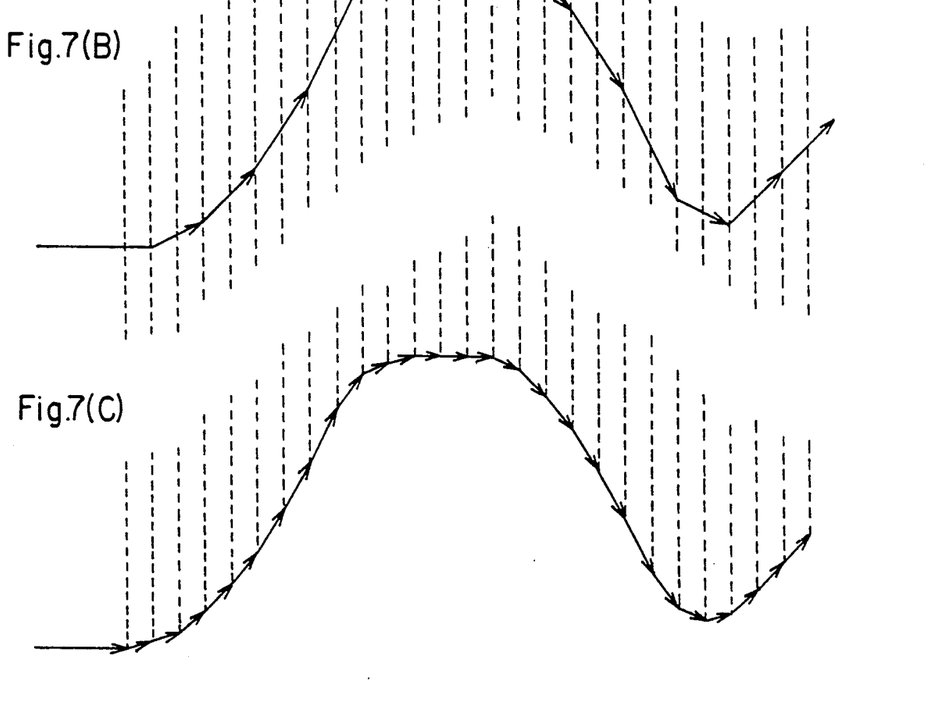

4 Fourth and Fifth Preferred Embodiments (FIGS. 5, 6 and 7)

These preferred embodiments relate to further digital-to-analog converters of the present invention.

FIG. 5 shows such a preferred embodiment that a plurality of circuit arrangements indicated in FIG. 1 are assembled, whereas FIG. 6 represents such a preferred embodiment that a plurality of circuit arrangements indicated in FIG. 2 are assembled. For the sake of simplicity, only two sets of circuit constructive elements shown in FIG. 1 or FIG. 2 are assembled in FIG. 5 or 6.

In the fourth preferred embodiment of FIG. 5, as shown in this drawing, this D/A converter is so constructed that a first calculation processing circuit CA1 is connected to a first binary D/A converting circuit DA1; a second calculation processing circuit CA2 is connected via a second binary D/A converting circuit DA2 to a delay circuit SR4 corresponding to a digital delay circuit for delaying a phase of a digital signal value outputted from a digital signal processing circuit (not shown) by only ½ sampling period, and also an adding/averaging circuit AD for adding the output values of the first calculation processing circuit CA1 and the second calculation processing circuit CA2 is connected to poststages of the first calculation processing circuit CA1 and the second calculation processing circuit CA2.

Assuming now that the output signal waveform derived from the first calculation processing circuit CA1 is represented by a solid line of FIG. 7A, the output signal waveform derived from the second calculation processing circuit CA2 becomes such an output signal wave delayed by only ½ sampling period, as shown in FIG. 7B, and then the output signal wave derived from the adding/averaging circuit AD becomes such a waveform produced by averaging both of the first-mentioned output signal waveform and the second-mentioned output signal waveform, as represented in FIG. 7C. The last-mentioned output signal waveform of the adding-/averaging circuit AD is a considerably smoother waveform than the waveform shown in FIG. 7A. As a consequence, the load of the LPF (not shown in detail) connected at the poststage of this adding/averaging circuit AD can be reduced to a great extent, so that the audient sound quality can be considerably improved, and this LPF may be omitted, if required.

It should be noted that the adding/averaging circuit AD may be constructed of an adder circuit for simply, merely adding the respective output values of the first and second calculation processing circuits to each other, if an amplifier circuit (not shown in detail) connected at the poststage of this adding/averaging circuit AD may be omitted.

As represented in FIG. 6, first, second and third sample/hold circuits SH1, SH2 and SH3 which each delays the analog output value of the D/A converting circuit DAC by only ½ sampling period are series-connected to the D/A converting circuit DAC in the fifth preferred embodiment. The D/A converter according to the fifth preferred embodiment is so arranged that both of the D/A converting circuit DAC and the second sample/-hold circuit SH2 are connected to the first calculation processing circuit CA1; both of the first sample/hold circuit SH1 and the third sample/hold circuit SH3 are connected to the second calculation processing circuit CA2; and also an adding/averaging circuit AD for adding/averaging the output signal values derived from the first calculation processing circuit CA1 and the second calculation processing circuit CA2 is connected to poststages of the first calculation processing circuit CA1 and the second calculation processing circuit CA2. With such a circuit arrangement, the output signal waveform of FIG. 7 can be obtained from the D/A converter according to the fifth preferred embodiment, as same as in the description of FIG. 5.

It should be understood that although two sets of calculation processing circuits have been employed in the D/A converters of FIGS. 5 and 6, the following modification may be apparently realized. That is to say, "N" ("N" being any integer greater than, or equal to 2) sets of calculation processing circuits; when analog signal values which each has been delayed by a 1/N sampling period are inputted to a second calculation processing circuit, a third calculation processing circuit, - - - , an N-th calculation processing circuit, respectively, except for a first calculation processing circuit, the output signal waveforms from the respective calculation processing circuits become output signal waveforms delayed by the 1/N sampling period; an output signal waveform of the adding/averaging circuit is such a waveform produced by averaging "N" pieces of output signal waveforms, which becomes a further smoothened waveform. As a consequence, the load given to the LPF (not shown) connected at the poststage of the adding/averaging circuit AD can be furthermore reduced and therefore the audient tone quality can be moreover improved.

It should be noted that although the internal circuit arrangements of the first and second calculation processing circuits CA1 and CA2 shown in FIGS. 5 and 6 were identical to the internal circuit arrangement of the calculation processing circuit in the first preferred embodiment, these internal circuit arrangements are not limited thereto, but may be identical to, for instance, the internal circuit arrangement of the calculation processing circuit in the third preferred embodiment.

What is claimed is:

1. A digital-to-analog converter comprising:
   (a) a binary digital-to-analog (D/A) converting circuit for outputting an analog output signal value, as a first analog output signal value, corresponding to each sampling point of a digital signal, and for outputting an analog output signal value, as a second analog output signal value, produced by delaying the first analog output signal value by only a 1 sampling period; and
   (b) a calculation processing circuit for inputting therein the analog signal values derived from the binary D/A converting circuit, said calculation processing circuit being arranged by a difference calculating unit for calculating a difference value between a first analog input signal value corresponding to said first analog output signal value and a second analog input signal value corresponding to said second analog output signal value, an integrating unit for integrating a difference value obtained from the difference calculating unit, and also an adding unit for adding an output value of the integrating unit with said second analog input signal value, whereby the output value of said integrating unit is outputted as an analog output value.

2. A digital-to-analog converter as claimed in claim 1, wherein said binary D/A converting circuit is constructed of:
   a first D/A converting circuit for converting the digital output signal value corresponding to each sampling point of the digital signal into an analog signal value;
   a delay circuit for delaying said digital output value by only the 1 sampling period; and
   a second D/A converting circuit for converting a digital signal value of said delay circuit into an analog signal value.

3. A digital-to-analog converter as claimed in claim 1, wherein said binary D/A converting circuit is arranged by:
   digital-to-analog converting circuit for converting the digital output signal value corresponding to the respective sampling points of the digital signal into an analog signal value; and
   a delay circuit for delaying said analog signal value by only a 1 sampling period.

4. A digital-to-analog converter as claimed in claim 1, wherein said calculation processing circuit is arranged in such a manner that:
   a first analog input corresponding to a digital signal is connected via a first resistor to one input side of an operational amplifying circuit;
   a second analog input corresponding to said digital signal and also delayed by only a 1 sampling period, is connected via a second resistor to the other input side of said operational amplifying circuit;
   said one input side of the operational amplifying circuit is connected to an output side of the operational amplifying circuit by a third resistor;
   a first series circuit constructed of a fourth resistor and a first capacitor is connected between the output side of said operational amplifying circuit and a ground;
   a fifth resistor is connected between said the other input side of the operational amplifying circuit and the ground; and
   a series circuit constructed of a sixth resistor and a buffer circuit is connected between a junction point between the fourth resistor of the series circuit and the first capacitor, and also said the other input side of the operational amplifying circuit.

5. A digital-to-analog converter as claimed in claim 1, wherein said calculation processing circuit is arranged in such a manner that:
   a first analog input corresponding to a digital signal is connected via a first resistor to one input side of an operational amplifying circuit;
   a second analog input corresponding to said digital signal and also delayed by only a 1 sampling period, is connected via a second resistor and a second capacitor to the other input side of said operational amplifying circuit;
   said one input side of the operational amplifying circuit is connected to an output side of the operational amplifying circuit by a third resistor;
   a first series circuit constructed of a fourth resistor and a first capacitor is connected between the output side of said operational amplifying circuit and a ground;
   a fifth resistor is connected between said the other input side of the operational amplifying circuit and the ground; and
   it constructed of a sixth resistor and a
   a series circuit constructed of a sixth resistor and a buffer circuit is connected between a junction point between the fourth resistor of the series circuit and the first capacitor, and also a junction point between said second resistor and said second capacitor.

6. A digital-to-analog converter as claimed in claim 1, wherein said calculation processing circuit is arranged by first, second, third, - - - , N-th calculation processing circuits, and is constructed in such a manner that:
   both of an analog signal value corresponding to a digital signal and of an analog signal value corresponding to said digital signal and delayed by only a 1 sampling period are inputted to a first calculation processing circuit;
   both of analog signal values corresponding to said digital signal and delayed by only 1/N, 2/N, - - - , (N-1/N) sampling periods, and of analog signal values corresponding said digital signal and delayed by only 1/N+1, 2/N+1, - - - , (N-1)/N+1 sampling periods are inputted to the second, third, - - - , N-th calculation processing circuits; and
   an adding/averaging circuit for adding or averaging the output signal values of all calculation processing circuits is connected to the output sides of said first, second, third, - - - , N-th calculation processing circuits.

* * * * *